United States Patent
Park et al.

(10) Patent No.: US 8,119,536 B2
(45) Date of Patent: Feb. 21, 2012

(54) SEMICONDUCTOR DEVICE AND METHOD OF FORMING THE SAME

(75) Inventors: Sang-Su Park, Seoul (KR); JaeHee Oh, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/622,738

(22) Filed: Nov. 20, 2009

(65) Prior Publication Data

US 2010/0144141 A1 Jun. 10, 2010

(30) Foreign Application Priority Data

Dec. 9, 2008 (KR) .................. 10-2008-0124780

(51) Int. Cl.
  *H01L 21/302* (2006.01)
(52) U.S. Cl. ................. 438/754; 438/102; 257/E45.002
(58) Field of Classification Search .................. 438/754, 438/102; 257/4, E45.002, 306
  See application file for complete search history.

(56) References Cited

U.S. PATENT DOCUMENTS

| 6,188,100 B1 * | 2/2001 | Hermes .................... 257/309 |
| 2008/0308784 A1 * | 12/2008 | Oh et al. .................... 257/4 |
| 2008/0315174 A1 * | 12/2008 | Kang et al. .................... 257/4 |
| 2009/0008623 A1 * | 1/2009 | Lim et al. .................... 257/4 |
| 2009/0200534 A1 * | 8/2009 | Rajendran et al. .................... 257/3 |

FOREIGN PATENT DOCUMENTS

| KR | 1020030002094 A | 1/2003 |
| KR | 1020070120242 A | 12/2007 |
| KR | 1020080039701 A | 5/2008 |

* cited by examiner

*Primary Examiner* — Mary Wilczewski
*Assistant Examiner* — Toniae Thomas
(74) *Attorney, Agent, or Firm* — Myers Bigel Sibley & Sajovec, P.A.

(57) ABSTRACT

Provided are a semiconductor device and a method of forming the semiconductor device. The method may include forming a semiconductor pattern on a substrate, forming an interlayer insulating layer including an opening exposing the semiconductor pattern, forming a semiconductor ohmic pattern on the semiconductor pattern, forming an electrode ohmic layer on the semiconductor ohmic pattern, performing a wet etching on the electrode ohmic layer, and forming an electrode pattern on the etched electrode ohmic layer.

8 Claims, 4 Drawing Sheets

SEMICONDUCTOR DEVICE AND METHOD OF FORMING THE SAME

REFERENCE TO PRIORITY APPLICATION

This application claims priority to Korean Patent Application No. 2008-0124780, filed Dec. 9, 2008, the contents of which are hereby incorporated herein by reference.

FIELD OF THE INVENTION

As electronic apparatuses become multi-functioned and to have a high capacity, semiconductor devices used in the electronic apparatuses also become small and highly integrated. Semiconductor devices may include a plurality of layers to obtain a miniaturization and a high integration.

BACKGROUND

In a formation of a semiconductor including a plurality of layers, the layers have to be electrically isolated from each other, but at the same time the layers have to be electrically connected to each other in a necessary region. For this, each layer may be electrically isolated from each other by an interlayer insulating layer and may be electrically connected to each other by conductor connecting the layers. In a formation of the conductor, a study for obtaining process margin and/or process efficiency is being performed.

SUMMARY

Exemplary embodiments provide a method of forming a semiconductor device. The method may include forming a semiconductor pattern on a substrate, forming an interlayer insulating layer including an opening exposing the semiconductor pattern, forming a semiconductor ohmic pattern on the semiconductor pattern, forming an electrode ohmic layer on the semiconductor ohmic pattern, performing a wet etching on the electrode ohmic layer, and forming an electrode pattern on the etched electrode ohmic layer.

DETAILED DESCRIPTION OF THE EMBODIMENTS

Figure 1:
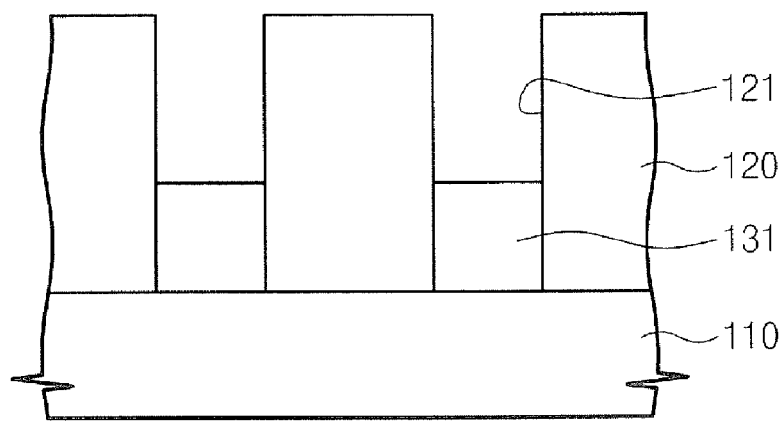
FIGS. 1 through 6 are drawings illustrating a method of forming a semiconductor device in accordance with an embodiment of the present invention.

Embodiments of the present invention now will be described more fully hereinafter with reference to the accompanying drawings, in which the embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

A method of forming a semiconductor device in accordance with an embodiment of the present invention by making reference to FIGS. 1 through 6.

Referring to FIG. 1, a semiconductor pattern 131 and an interlayer insulating layer 120 may be formed on a substrate 110. The substrate 110 may include any semiconductor based structure having a semiconductor surface. The substrate 110 may include silicon or another semiconductor elements. The substrate 110 may include a conductive region and/or an insulating region.

The interlayer insulating layer 120 is formed on the substrate 110 and may define an opening 121 exposing the substrate 110. The opening 121 may be formed by patterning an insulating material until the substrate 110 is exposed after forming the insulating material on the substrate. The interlayer insulating layer 120 may be an oxide layer, for example, a high density plasma (HDP) layer.

The semiconductor pattern 131 may be formed in the opening 121 on the substrate 110. The semiconductor pattern 131 may be formed to fill a lower portion of the opening 121. The semiconductor pattern 131 may be formed by an epitaxial process using the substrate 110 as a seed layer. The semiconductor pattern 131 may be a single crystalline structure including a semiconductor element. For example, the semiconductor pattern 131 may be a single crystalline structure including a silicon element.

Dopants may be further implanted into the semiconductor pattern 131. For example, a diode may be formed in the semiconductor pattern 131. In this case, the semiconductor pattern 131 may include a first portion including dopants of a first conductivity type and a second portion including dopants of a second conductivity type. The dopants of first and second conductivity types may be implanted into the semiconductor pattern 131 by at least one of an in situ process and an ion implantation process.

Alternatively, the semiconductor pattern 131 may be a region including dopants in the substrate 110. The semiconductor pattern 131 may be formed by implanting dopants into a portion of the substrate 110. At this time, the interlayer insulating layer 120 and the opening 121 may be formed after the semiconductor pattern 131 is formed.

Figure 2:
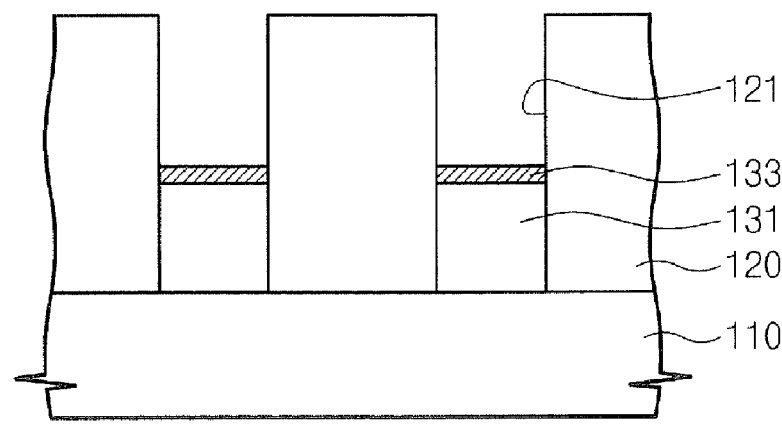

Referring to FIG. 2, a semiconductor ohmic pattern 133 may be formed on the semiconductor pattern 131. The semiconductor ohmic pattern 133 may be formed by forming an ohmic metal layer conformally on a sidewall of the opening 121 and the semiconductor pattern 131, and subsequently performing an annealing process. The ohmic metal layer may be formed by a physical vapor deposition (PVD) process including a sputtering process, or a chemical vapor deposition (CVD) process.

The ohmic metal layer may, for example, include cobalt (Co) or nickel (Ni). A semiconductor element of the semiconductor pattern 131 reacts to a metal element of the ohmic metal layer by the annealing process, thereby forming the semiconductor ohmic pattern 133 on the semiconductor pattern 131. The semiconductor ohmic pattern 133 may, for example, include cobalt-semiconductor compound or nickel-semiconductor compound. After the semiconductor ohmic pattern 133 is formed, the ohmic metal layer which does not react to the semiconductor pattern 131 may be removed.

The semiconductor ohmic pattern 133 and the semiconductor pattern 131 may include at least the same one element. For example, the semiconductor ohmic pattern 133 and the semiconductor pattern 131 may include a silicon element. The semiconductor ohmic pattern 133 may include material having a resistivity equal to or smaller than that of the semiconductor pattern 131.

Figure 3:
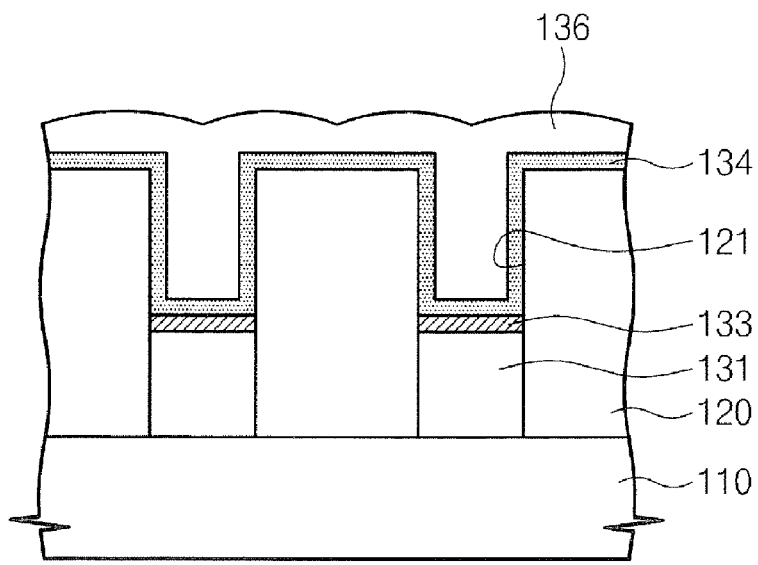

Referring to FIG. 3, an electrode ohmic layer 134 is formed on the semiconductor pattern 131. The electrode ohmic layer 134 can conformally cover the opening 121 in which the semiconductor ohmic pattern 133 is formed. The electrode ohmic layer 134 may include a metal element. For example, the electrode ohmic layer 134 may include titanium (Ti) or tantalum (Ta). A nitrogen process may be further performed on the electrode ohmic layer 134. In the case when the nitrogen process is performed, the electrode ohmic layer 134 may include a metal layer which is in contact with the semiconductor ohmic pattern 133 and a metal nitride layer located on the metal layer.

A first fillingfilling insulating layer 136 may be formed on the electrode ohmic layer 134. The first filling insulating layer 136 may fill the opening 121. The first filling insulating layer 136 may include material having an etching selectivity with respect to the interlayer insulating layer 120. For example, when the interlayer insulating layer 120 includes an oxide, the first filling insulating layer 136 may include a nitride.

Figure 4:
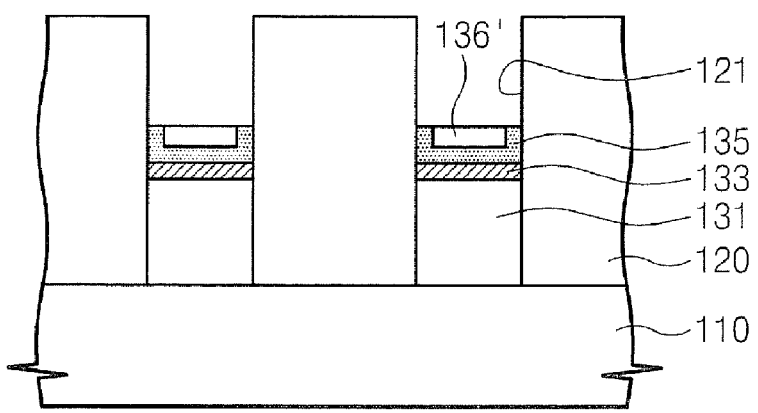

Referring to FIG. 4, a portion of the first filling insulating layer 136 and the electrode ohmic layer 134 is removed to form a first filling insulating pattern 136' and the electrode ohmic pattern 135.

Forming the first filling insulating pattern 136' may include planarizing the first filling insulating layer 136 and performing a wet etching on the planarized first filling insulating layer 136. For example, the first filling insulating layer 136 may be planarized by a chemical mechanical polishing process. A wet etching process is performed on the planarized first filling insulating layer 136 until a sidewall of the opening 121 is exposed to form the first filling insulating pattern 136'. The wet etching may be performed by an etching solution. The first filling insulating pattern 136' may have a greater etching rate in comparison with the interlayer insulating layer 120 for the etching solution. For example, the etching solution may include phosphoric acid and standard clean-1(SC-1). A portion of the first filling insulating layer 136 may be removed when the wet etching is performed. Alternatively, an entire portion of the first filling insulating layer 136 is removed to expose a top surface of the electrode ohmic pattern 135.

Forming the electrode ohmic pattern 135 may include performing a wet etching on the electrode ohmic layer 134. An etching of the electrode ohmic layer 134 may be performed in concurrence with an etching of the first filling insulating layer 136 or may be performed after the first filling insulating pattern 136' is formed.

As described above, the electrode ohmic pattern 135 may be formed by performing a wet etching on the electrode ohmic layer 134, after forming the electrode ohmic layer 134 conformally on the semiconductor ohmic pattern 133. Thus, a process defect (e.g., seam) which occurs when the electrode ohmic pattern 135 is formed to have a plug shape can be prevented. Performing a chemical mechanical polishing process on the electrode ohmic layer 134 may be not essential to form the electrode ohmic pattern 135. Thus, when forming the electrode ohmic layer 134, the amount of being removed during the chemical mechanical polishing process may not be additionally considered. As a result, a process margin may be obtained.

Figure 5:
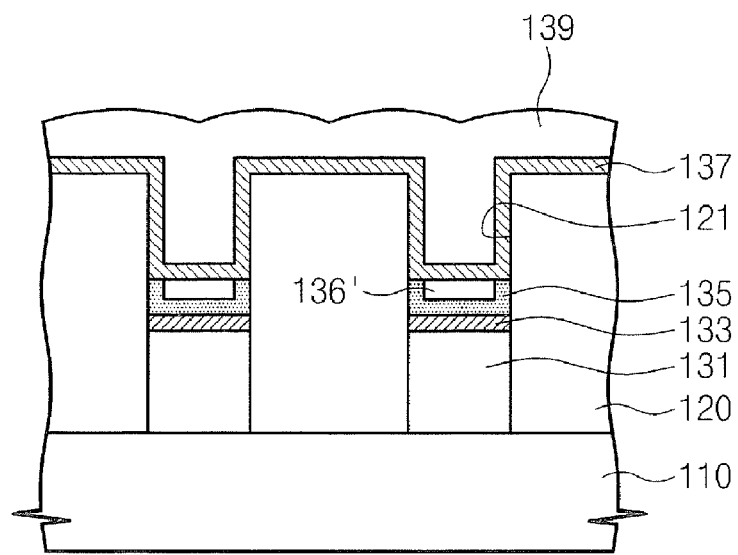

Referring to FIG. 5, an electrode layer 137 may be formed on the electrode ohmic pattern 135. The electrode layer 137 may contact with the electrode ohmic pattern 135. The electrode layer 137 may be conformally formed in the opening 121. The electrode layer 137 may be formed by a physical vapor deposition including a sputtering process, or a chemical vapor deposition process. The electrode layer 137 may include at least one of elements included in the electrode ohmic pattern 135. For example, the electrode layer 137 may include the metal element included in the electrode ohmic pattern 135. More specifically, when the electrode ohmic pattern 135 includes titanium, the electrode layer 137 may include titanium. The electrode layer 137 may include material having a resistivity equal to or smaller than a resistivity of material constituting the electrode ohmic pattern 135.

A second filling insulating layer 139 may be formed on the electrode layer 137. The second filling insulating layer 139 may fill the opening 121 in which the electrode layer 137 is formed. The second filling insulating layer 139 may be formed from an insulating material including an oxide and a nitride, but it is not limited to the previously recited material.

Figure 6:
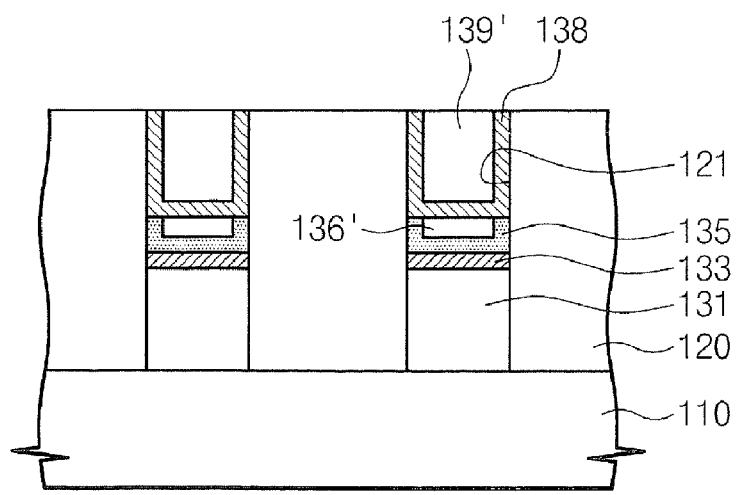

Referring to FIG. 6, at least a portion of the second filling insulating layer 139 and the electrode layer 137 is removed, so that a second filling insulating pattern 139' and an electrode pattern 138 are formed. Removing the portion of the second filling insulating layer 139 and the electrode layer 137 may include performing a wet etching process and a planarization process. For example, a wet etching process may be performed to the second filling insulating layer 139. A top portion of the second filling insulating layer 139 may be removed by the wet etching process. After that, a planarization process may be performed to the electrode layer 137 and the second filling insulating layer 139 of which the top portion is removed. The planarization may be performed until a top surface of the interlayer insulating layer 120 is exposed. The second filling insulating pattern 139' and the electrode pattern 138 may be disposed in a limited region in the opening 121 by the planarization process.

Since the electrode pattern 138 is formed in the opening 121 as described above, a photolithography process for a formation of the electrode pattern 138 may not be essential. Accordingly, the electrode pattern 138 can be formed by a more simplified process, so process efficiency can be maximized.

Referring back to FIG. 6, a semiconductor device in accordance with an embodiment of the present invention is described. A portion of the descriptions discussed by making reference to FIGS. 1 through 6 may be omitted. A semiconductor pattern 131 may be disposed on a substrate 110. The substrate 110 may be a semiconductor substrate including a conductive region and/or an insulating region. The semiconductor pattern 131 may be electrically connected to a conductive region of the substrate 110. The semiconductor pattern 131 may include at least one semiconductor element. The semiconductor pattern 131 may, for example, include single crystalline silicon. Specifically, the semiconductor pattern 131 may include a diode. In this case, the semiconductor pattern 131 may include a first region including dopants of a first conductivity type and a second region including dopants of a second conductivity type.

An interlayer insulating layer 120 which is in contact with a sidewall of the semiconductor pattern 131 may be disposed on the substrate 110. The interlayer insulating layer 120 surrounds a sidewall of the semiconductor pattern 131, and may include a top surface higher than a top surface of the semiconductor pattern 131. That is, the interlayer insulating layer 120 includes an opening 121 exposing the substrate 110 and the semiconductor pattern 131 may be disposed in the opening 121. The interlayer insulating layer 120 may include a silicon oxide. As an alternative to that depicted in FIG. 6, the interlayer insulating layer 120 may include a plurality of layers. For example, the interlayer insulating layer 120 may include a first interlayer insulating layer having a top surface which is coplanar with the top surface of semiconductor pattern 131 and a second interlayer insulating layer disposed on the first interlayer insulating layer.

A semiconductor ohmic pattern 133 may be disposed on the semiconductor pattern 131. The semiconductor ohmic pattern 133 may contact with the semiconductor pattern 131. The semiconductor ohmic pattern 133 may include material having a resistivity equal to or smaller than a resistivity of the semiconductor pattern 131. For example, the semiconductor ohmic pattern 133 may include the same semiconductor element as the semiconductor element included in the semiconductor pattern 131. In addition, the semiconductor ohmic pattern 133 may include metal element. Specifically, when the semiconductor pattern 131 includes silicon element, the semiconductor ohmic pattern 133 may include metal silicide.

An electrode ohmic pattern 135 may be disposed on the semiconductor ohmic pattern 133. The electrode ohmic pattern 135 may contact with a top surface of the semiconductor ohmic pattern 133 and a side surface of the electrode ohmic pattern 135 may be coplanar with a side surface of the semiconductor ohmic pattern 133. The electrode ohmic pattern 135 may include a bottom portion which is in contact with a top surface of the semiconductor ohmic pattern 133 and a wall portion protruding from edges of the bottom portion along a sidewall of the opening 121. That is, the electrode ohmic pattern 135 may have a cylindrical shape including a bottom portion in one side. Alternatively, the electrode ohmic pattern 135 may not include the wall portion. Specifically, the electrode ohmic pattern 135 may include only a bottom portion parallel to the top surface of semiconductor ohmic pattern 133 and may not include a protrusive portion.

The electrode ohmic pattern 135 may include a plurality of layers. For example, the electrode ohmic pattern 135 may include a metal layer adjacent to the semiconductor ohmic pattern 133 and a metal compound layer disposed on the metal layer. More specifically, the metal layer may include titanium and the metal compound layer may include titanium nitride. Alternatively, the semiconductor ohmic pattern 133 may be a single metal layer or a single metal compound layer.

A first filling insulating pattern 136' may be disposed in a region limited by the bottom portion and the wall portion of electrode ohmic pattern 135. The first filling insulating pattern 136' may include a lower surface which is in contact with the bottom portion of electrode ohmic pattern 135 and a side surface which is in contact with the wall portion of electrode ohmic pattern 135. In the case when the electrode ohmic pattern 135 does not include the wall portion, the first filling insulating pattern 136' may not exist. The first filling insulating pattern 136' may be spaced apart from the interlayer insulating layer 120 by the electrode ohmic pattern 135. The first filling insulating pattern 136' may include different material from insulating material included in the interlayer insulating layer 120. For example, the first filling insulating pattern 136' may include a nitride and the interlayer insulating layer 120 may include an oxide.

An electrode pattern 138 is disposed on the electrode ohmic pattern 135. The electrode pattern 138 may be disposed in the opening 121. An outer surface of a sidewall of the electrode pattern 138 may be coplanar with outer surfaces of sidewalls of the semiconductor pattern 131, the semiconductor ohmic pattern 133 and the electrode ohmic pattern 135. The electrode pattern 138 may be in contact with top surfaces of the sidewalls of the electrode ohmic pattern 135. In the case when the electrode ohmic pattern 135 does not include the wall portion, the electrode pattern 138 may be in contact with a top surface of the bottom portion of the electrode ohmic pattern 135.

The electrode pattern 138 may include a bottom portion which contacts with the electrode ohmic pattern 135, and a wall portion extending along a sidewall of the opening 121 from edges of the bottom portion. The electrode pattern 138 may be a cylinderical shaped. That is, a cross section of the electrode pattern 138 taken along a direction perpendicular to a top surface of the substrate 110 may have a U-shape. Alternatively, the electrode pattern 138 may be a filled pillar shaped filling an upper portion of the opening 121. A top surface of the electrode pattern 138 may be coplanar with a top surface of the interlayer insulating layer 120.

The electrode pattern 138 may include material having a resistivity equal to or smaller than a resistivity of the electrode ohmic pattern 135. The electrode pattern 138 may include a metal element. For example, the electrode pattern 138 may include the same metal element as the metal element included in the electrode ohmic pattern 135. For example, in the case when the electrode ohmic pattern 135 includes titanium and/or titanium nitride, the electrode pattern 138 may include titanium.

When the electrode pattern 138 is cylindrical shaped, a second filling insulating pattern 139' filling the inside of electrode pattern 138 may be further disposed. The second filling insulating pattern 139' may include a bottom which is in contact with the bottom portion of electrode pattern 138 and a sidewall which is in contact with the wall portion of electrode pattern 138. A top surface of the second filling insulating pattern 139' may be coplanar with the top surface of electrode pattern 138 and/or the top surface of interlayer insulating layer 120. That is, the second filling insulating pattern 139' may be pillar type and fill an inside space of the electrode pattern 138. The second filling insulating pattern 139' may include the same material as the first filling insulating pattern 136', but it is not limited to the previously recited material. The second filling insulating pattern 139' may be spaced apart from the interlayer insulating layer 120 by the electrode pattern 138.

Figure 7:
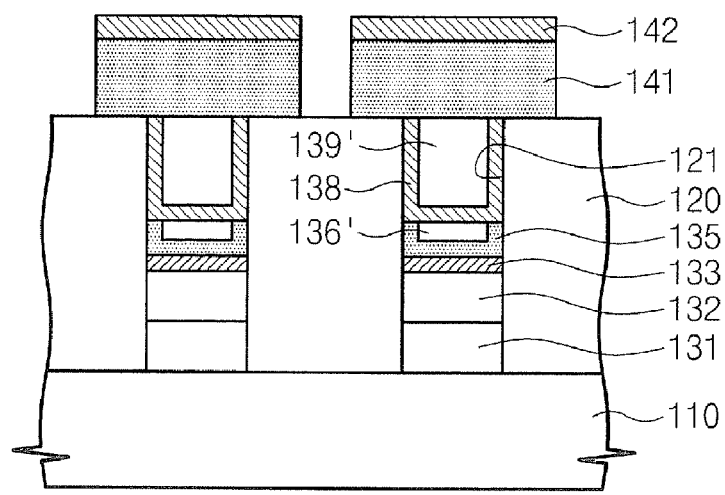
FIG. 7 is a drawing illustrating an application example in accordance with embodiments of the present invention.

An application example of embodiments of the present invention is described by making reference to FIG. 7. The present application example is described by applying an embodiment described by making reference to FIG. 6 and may be described by applying other embodiments. The descriptions discussed above may be partly omitted.

Referring to FIG. 7, semiconductor patterns 131 and 132 are disposed on a substrate 110. The semiconductor patterns 131 and 132 may include diodes. For example, the semiconductor patterns 131 and 132 may include a first semiconductor pattern 131 including dopants of a first conductivity type and a second semiconductor pattern 132 including dopants of a second conductivity type.

A semiconductor ohmic pattern 133 may be disposed on the semiconductor patterns 131 and 132. The semiconductor ohmic pattern 133 may include the same semiconductor element as a semiconductor element included in the semiconductor patterns 131 and 132. A resistivity of the semiconductor ohmic pattern 133 may be equal to or smaller than a resistivity of the semiconductor patterns 131 and 132.

An electrode ohmic pattern 135 may be disposed on the semiconductor ohmic pattern 133. The electrode ohmic pattern 135 may be electrically connected to the semiconductor ohmic pattern 133. The electrode ohmic pattern 135 may include at least one metal element. A first filling insulating pattern 136' may be disposed in a region limited by the electrode ohmic pattern 135.

A first electrode pattern 138 may be disposed on the electrode ohmic pattern 135. The first electrode pattern 138 may include the same metal element as a metal element included in the electrode ohmic pattern 135. A resistivity of the first electrode pattern 138 may be equal to or smaller than a resistivity of the electrode ohmic pattern 135. A second filling insulating pattern 139' may be disposed in a region limited by the first electrode pattern 138.

The semiconductor patterns 131 and 132, the semiconductor ohmic pattern 133, the electrode ohmic pattern 135 and the electrode pattern 138 may be disposed in a region limited by an interlayer insulating layer 120. As an alternative to that depicted in FIG. 7, the interlayer insulating layer 120 may include a plurality of layers.

A variable resistance pattern 141 may be disposed on the electrode pattern 138. The variable resistance patter 141 may include material a resistance of which is varied due to a thermal factor and/or an electrical factor. For example, the variable resistance pattern 141 may include chalcogen compound. When the variable resistance pattern 141 is disposed on the electrode pattern 138, the semiconductor patterns 131 and 132 may be used as a switching device of a cell including the variable resistance pattern 141.

A second electrode pattern 142 may be disposed on the variable resistance pattern 141. The second electrode pattern 142 may function as an upper electrode of a cell including the variable resistance pattern 141. A capping layer may be further interposed between the second electrode pattern 142 and the variable resistance pattern 141.

Figure 8:
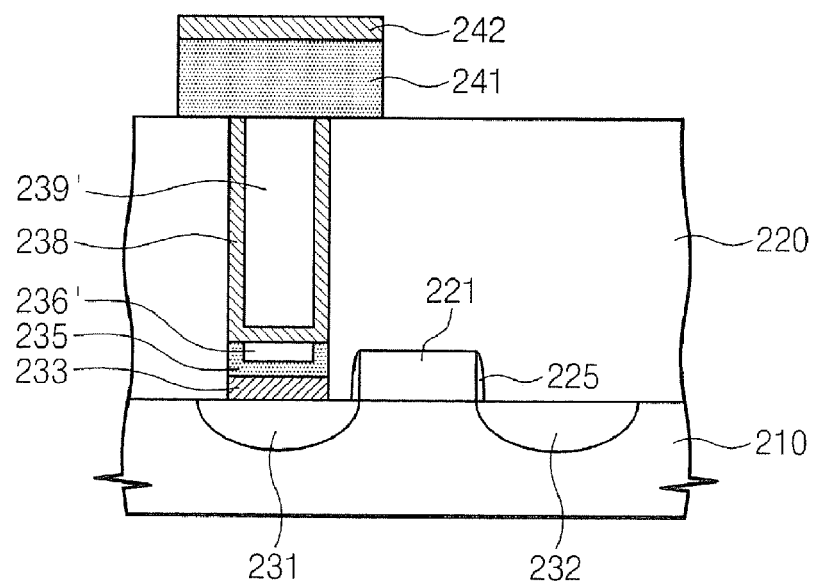
FIG. 8 is a drawing illustrating another application example in accordance with embodiments of the present invention.

Referring to FIG. 8, another application example in accordance with embodiments of the present invention is described. A gate pattern 221 may be disposed on a substrate 210. The gate pattern 221 may include a tunnel oxide layer, a floating gate, a control gate and an intergate insulating layer. A spacer 225 may be further disposed on a sidewall of the gate pattern 221. Impurity regions 231 and 232 may be disposed at both sides of the gate pattern 221. The impurity regions 231 and 232 may be disposed in the substrate 210. The impurity regions 231 and 232 may be disposed in an n-type well or a p-type well inside of the substrate 210. The impurity regions 231 and 232 may be a semiconductor pattern in accordance with embodiments of the present invention. The impurity regions 231 and 232 may include semiconductor elements. The semiconductor elements may be a single crystalline state. The impurity regions 231 and 232 may be source/drain regions.

A semiconductor ohmic pattern 233 may be disposed on one region 231 of the impurity regions 231 and 232. The one region 231 of the impurity regions 231 and 232 may be electrically connected to the semiconductor ohmic pattern 233. The semiconductor ohmic pattern 233 may include the same semiconductor element as a semiconductor element included in the impurity regions 231 and 232. A resistivity of the semiconductor ohmic pattern 233 may be equal to or smaller than a resistivity of the impurity regions 231 and 232.

An electrode pattern 235 may be disposed on the semiconductor ohmic pattern 233. The electrode pattern 235 may have a cylindrical shape including a bottom portion which is in contact with a top surface of the semiconductor ohmic pattern 233. Alternatively, the electrode ohmic pattern 235 may be a flat surface not including a protrusive portion. The electrode ohmic pattern 235 may be a metal layer, a metal compound layer or a lamination thereof. When the electrode ohmic pattern 235 has a cylindrical shape including a bottom portion, a first filling insulating pattern 236' may be further formed in a limited region inside of the electrode ohmic pattern 235.

A first electrode pattern 238 may be disposed on the electrode ohmic pattern 235. The first electrode pattern 238 may have a cylindrical shape including a bottom portion in one side. A bottom surface of the bottom portion may be in contact with a top surface of the electrode ohmic pattern 235. An inside region of the first electrode pattern 238 may be filled with a second filling insulating pattern 239'. Alternatively, the first electrode pattern 238 may have a cylindrical shape an inside of which is filled.

The semiconductor ohmic pattern 233, the electrode ohmic pattern 235 and the first electrode pattern 238 may be disposed in an opening that is defined in an interlayer insulating layer 220. External sidewalls of the semiconductor ohmic pattern 233, the electrode ohmic pattern 235 and the first electrode pattern 238 may be coplanar with each other.

A variable resistance pattern 241 may be further provided on the interlayer insulating layer 220 and the electrode pattern 238. A resistance of the variable resistance pattern 241 may be varied by a thermal factor and/or an electrical factor. For example, the variable resistance pattern 241 may include chalcogen compound. A second electrode pattern 242 may be disposed on the variable resistance pattern 241.

According to embodiments of the present invention, an electrode ohmic pattern is formed by performing a wet etching on an electrode ohmic layer formed on a semiconductor pattern. As a result, damages which can occur during a formation of the electrode ohmic pattern may be minimized and a process margin can be obtained. In addition, a contact characteristic with an electrode pattern formed on the electrode ohmic pattern can be improved. Furthermore, the electrode ohmic pattern may be formed in an opening without an additional photolithography process and/or an etching process, thereby maximizing process efficiency.

What is claimed is:

1. A method of forming a semiconductor device comprising:
    forming a semiconductor pattern, and an interlayer insulating layer including an opening exposing the semiconductor pattern on a substrate;
    forming a semiconductor ohmic pattern on the semiconductor pattern;
    forming an electrode ohmic layer on the semiconductor ohmic pattern;
    forming an electrode ohmic pattern in the opening by performing a wet etching on the electrode ohmic layer; and
    forming an electrode pattern in the opening on the electrode ohmic pattern;
    wherein the semiconductor pattern and the semiconductor ohmic pattern comprise at least one same semiconductor element and wherein the electrode pattern and the electrode ohmic layer comprise at least one same metal element.

2. A method of forming a semiconductor device comprising:
    forming a semiconductor pattern, and an interlayer insulating layer including an opening exposing the semiconductor pattern on a substrate;
    forming a semiconductor ohmic pattern on the semiconductor pattern;
    forming an electrode ohmic layer on the semiconductor ohmic pattern;
    forming an electrode ohmic pattern in the opening by performing a wet etching on the electrode ohmic layer; and
    forming an electrode pattern in the opening on the electrode ohmic pattern;
    wherein the semiconductor pattern, the semiconductor ohmic pattern, the electrode ohmic pattern and the electrode pattern are formed in the opening.

3. A method of forming a semiconductor device comprising:
    forming a semiconductor pattern, and an interlayer insulating layer including an opening exposing the semiconductor pattern on a substrate;
    forming a semiconductor ohmic pattern on the semiconductor pattern;
    forming an electrode ohmic layer on the semiconductor ohmic pattern and in the opening;
    forming an electrode ohmic pattern in the opening by performing a wet etching on the electrode ohmic layer;
    forming an electrode pattern in the opening on the electrode ohmic pattern;
    forming a filling insulating layer filling the opening on the electrode ohmic layer;
    removing the filling insulating layer except the opening; and
    lowering a top surface of the filling insulating layer in the opening than a top surface of the interlayer insulating layer.

4. A method of forming a semiconductor device comprising:
    forming a semiconductor pattern, and an interlayer insulating layer including an opening exposing the semiconductor pattern on a substrate;
    forming a semiconductor ohmic pattern on the semiconductor pattern;
    forming an electrode ohmic layer on the semiconductor ohmic pattern;
    forming an electrode ohmic pattern in the opening by performing a wet etching on the electrode ohmic layer; and
    forming an electrode pattern in the opening on the electrode ohmic pattern, said forming an electrode pattern comprising:
        conformally forming an electrode layer on the substrate including the opening where the electrode ohmic pattern is formed;
        forming a filling insulating layer filling the opening; and
        removing a portion of the electrode layer and the filling insulating layer.

5. A method of forming a semiconductor device comprising:
    forming a semiconductor pattern, and an interlayer insulating layer including an opening exposing the semiconductor pattern on a substrate;
    forming a semiconductor ohmic pattern on the semiconductor pattern;
    forming an electrode ohmic layer on the semiconductor ohmic pattern;
    forming an electrode ohmic pattern in the opening by performing a wet etching on the electrode ohmic layer; and
    forming an electrode pattern in the opening on the electrode ohmic pattern;
    wherein forming the semiconductor pattern, and the interlayer insulating layer including the opening on the substrate comprises:
        forming an interlayer insulating layer on the substrate;
        patterning the interlayer insulating layer to expose a portion of the substrate; and growing a semiconductor pattern using the substrate as a seed layer.

6. The method of claim 5, wherein the semiconductor pattern comprises a first portion including dopants of a first conductivity type and a second portion including dopants of a second conductivity type.

7. A method of forming a semiconductor device comprising:
- forming a semiconductor pattern, and an interlayer insulating layer including an opening exposing the semiconductor pattern on a substrate;
- forming a semiconductor ohmic pattern on the semiconductor pattern;
- forming an electrode ohmic layer on the semiconductor ohmic pattern;
- forming an electrode ohmic pattern in the opening by performing a wet etching on the electrode ohmic layer; and
- forming an electrode pattern in the opening on the electrode ohmic pattern;
- wherein forming the semiconductor ohmic pattern comprises:
  - forming an ohmic metal layer on the semiconductor pattern; and
  - reacting semiconductor elements included in the semiconductor pattern to elements included in the ohmic metal layer.

8. A method of forming a semiconductor device comprising:
- forming a semiconductor pattern, and an interlayer insulating layer including an opening exposing the semiconductor pattern on a substrate;
- forming a semiconductor ohmic pattern on the semiconductor pattern;
- forming an electrode ohmic layer on the semiconductor ohmic pattern;
- forming an electrode ohmic pattern in the opening by performing a wet etching on the electrode ohmic layer;
- forming an electrode pattern in the opening on the electrode ohmic pattern; and
- forming a variable resistance pattern on the electrode pattern.

* * * * *